US011114989B2

(12) United States Patent
Goto et al.

(10) Patent No.: US 11,114,989 B2
(45) Date of Patent: Sep. 7, 2021

(54) POWER AMPLIFYING CIRCUIT

(71) Applicant: Murata Manufacturing Co., Ltd., Kyoto (JP)

(72) Inventors: Satoshi Goto, Kyoto (JP); Hideyuki Satou, Kyoto (JP); Satoshi Tanaka, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 35 days.

(21) Appl. No.: 16/694,025

(22) Filed: Nov. 25, 2019

(65) Prior Publication Data

US 2020/0169232 A1 May 28, 2020

(30) Foreign Application Priority Data

Nov. 28, 2018 (JP) .............................. JP2018-222238
Jan. 30, 2019 (JP) .............................. JP2019-014642
Sep. 10, 2019 (JP) .............................. JP2019-164813

(51) Int. Cl.
*H03F 3/04* (2006.01)
*H03F 3/24* (2006.01)
*H03F 1/02* (2006.01)

(52) U.S. Cl.
CPC ............ *H03F 3/245* (2013.01); *H03F 1/0211* (2013.01); *H03F 2200/102* (2013.01); *H03F 2200/378* (2013.01); *H03F 2200/451* (2013.01)

(58) Field of Classification Search
CPC .... H03F 1/0211; H03F 3/04; H03F 2200/102; H03F 2200/378

USPC ......................................... 330/127, 136, 297
See application file for complete search history.

(56) References Cited

U.S. PATENT DOCUMENTS

| 8,598,950 | B2  | 12/2013 | Khesbak |
| 8,786,373 | B2  | 7/2014  | Presti et al. |
| 2013/0214862 | A1 | 8/2013 | Presti et al. |
| 2019/0052238 | A1* | 2/2019 | Yan ........................ H03F 1/0211 |

FOREIGN PATENT DOCUMENTS

| JP | 2015-507452 A | 3/2015 |
| JP | 5859685 B2    | 2/2016 |

\* cited by examiner

*Primary Examiner* — Steven J Mottola
(74) *Attorney, Agent, or Firm* — Pearne & Gordon LLP

(57) ABSTRACT

A power amplifying circuit includes an amplifier that amplifies a radio-frequency signal and a bypass capacitor section connected to a power supply terminal for supplying a power supply voltage to the amplifier. The bypass capacitor section includes a first capacitor, a second capacitor, and a first switch circuit. The first capacitor includes a first end connected to a power supply path, and a second end. The second capacitor includes a first end connected to the second end of the first capacitor and a second end connected to ground. The first switch circuit includes a first terminal connected to the second end of the first capacitor and the first end of the second capacitor, and a second terminal connected to the ground. The first switch circuit switches between connection and non-connection between the second end of the first capacitor and the ground.

18 Claims, 19 Drawing Sheets

POWER AMPLIFYING CIRCUIT

This application claims priority from Japanese Patent Application No. 2018-222238 filed on Nov. 28, 2018, and claims priority from Japanese Patent Application No. 2019-014642 filed on Jan. 30, 2019, and claims priority from Japanese Patent Application No. 2019-164813 filed on Sep. 10, 2019. The content of these applications are incorporated herein by reference in their entireties.

BACKGROUND

The present disclosure relates to a power amplifying circuit. A mobile communication terminal, such as a cellular phone, includes a power amplifying circuit that amplifies a radio-frequency (RF) signal to be transmitted to a base station. As a technique for enhancing the efficiency of the power amplifying circuit, envelope tracking (ET) control is available in which a power supply voltage is dynamically controlled in accordance with the level of an RF signal.

For example, U.S. Pat. No. 8,598,950 discloses a power amplifying circuit including an envelope tracker that controls a power supply voltage on the basis of an envelope of an RF signal, a plurality of amplifiers that are supplied with a power supply voltage from the envelope tracker, and bypass capacitors, each including a first end connected between the envelope tracker and a corresponding one of the amplifiers and a grounded second end and each being switchable between ON and OFF by a switch. In this power amplifying circuit, a bypass capacitor connected to a disabled amplifier is disconnected by a switch, thereby reducing a capacitive load on the envelope tracker and enhancing the efficiency of the power amplifying circuit.

BRIEF SUMMARY

In the configuration disclosed in U.S. Pat. No. 8,598,950, a capacitance value is determined by a combined capacitance of capacitors in accordance with ON/OFF of a switch. Thus, in a case where a power supply voltage is high, it is necessary to ensure a withstand voltage by one capacitor and thus to increase the withstand voltage.

Accordingly, the present disclosure provides a power amplifying circuit that is capable of switching between a decoupling capacitance suitable for ET control and a decoupling capacitance suitable for average power tracking (APT) control and that includes a capacitance element having a reduced withstand voltage compared to U.S. Pat. No. 8,598,950.

According to an embodiment of the present disclosure, a power amplifying circuit includes a bipolar transistor that amplifies a radio-frequency signal, and a bypass capacitor section connected between a collector end of the bipolar transistor and a power supply terminal connected to the collector end. The bypass capacitor section includes a first capacitor including a first end and a second end, a second capacitor including a first end and a second end, and a first switch circuit including a first terminal and a second terminal. The first end of the first capacitor is connected to the power supply terminal, and the second end of the first capacitor is connected to the first end of the second capacitor and the first terminal of the first switch circuit. The second end of the second capacitor is connected to ground. The second terminal of the first switch circuit is connected to the ground. Switching between ON and OFF of the first switch circuit causes switching between connection and non-connection between the second end of the first capacitor and the ground.

According to this embodiment, by changing the capacitance value of the bypass capacitor section in accordance with a control mode of a power supply voltage, an appropriate capacitor can be connected in accordance with an operation condition, and the withstand voltage of each capacitor can be reduced.

According to embodiments of the present disclosure, an appropriate capacitor can be connected in accordance with an operation condition regardless of a control mode of a power supply voltage, and the withstand voltage of each capacitor can be reduced.

Other features, elements, characteristics and advantages of the present disclosure will become more apparent from the following detailed description of embodiments of the present disclosure with reference to the attached drawings.

DETAILED DESCRIPTION

Figure 1:
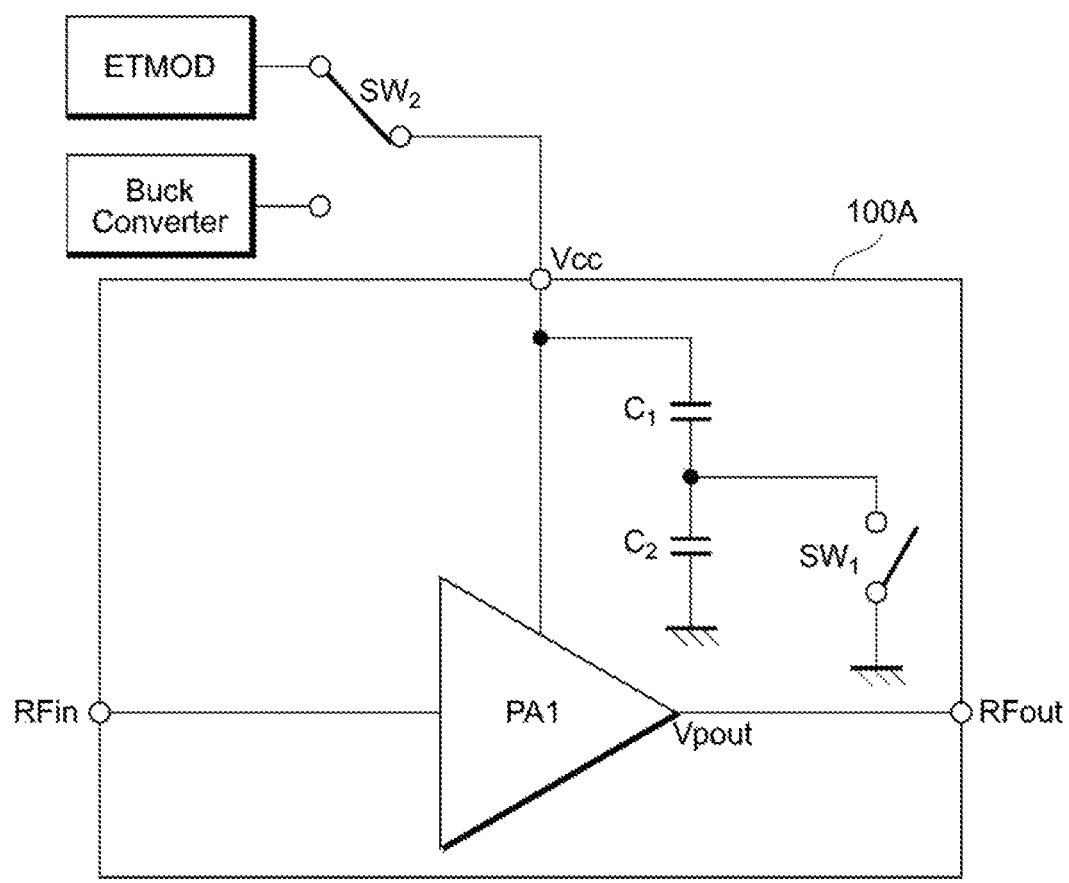
FIG. 1 is a schematic configuration diagram of a power amplifying circuit according to a first embodiment.

Embodiments of the present disclosure will be described with reference to the attached drawings. In individual figures, components denoted by the same reference numerals or symbols have identical or similar configurations.

First Embodiment (1) Configuration

FIG. 1 is a schematic configuration diagram of a power amplifying circuit 100A according to a first embodiment.

In a mobile communication terminal, such as a cellular phone, the power amplifying circuit 100A amplifies the power of an input signal RFin to a level at which the signal can be transmitted to a base station, and outputs a resulting signal as an amplified signal RFout. The power amplifying circuit 100A includes a power supply terminal Vcc. The power supply terminal Vcc is selectively supplied with a power supply voltage from an envelope tracking (ET) modulator or a buck converter (step-down DC-DC converter). To implement the above, for example, a switch SW2 having a single-pole double-throw (SPDT) configuration is used to switch between the ET modulator and the buck converter. The ET modulator is a power supply voltage supplying circuit for an ET control mode, whereas the buck converter is a power supply voltage supplying circuit for an average power tracking (APT) control mode. The power amplifying circuit 100A performs an operation based on the ET control mode when the power supply terminal Vcc is connected to the ET modulator. The power amplifying circuit 100A performs an operation based on the APT control mode when the power supply terminal Vcc is connected to the buck converter. Although the buck converter is used here, a step-up/step-down DC-DC converter may be alternatively used.

As illustrated in FIG. 1, the power amplifying circuit 100A includes, for example, a power amplifier PA1, a capacitor C1 (a first capacitor), a capacitor C2 (a second capacitor), and a switch SW1 (a first switch circuit). The power amplifier PA1 includes, for example, a transistor (amplifier) that receives and amplifies an input signal RFin and outputs an amplified signal RFout. The transistor may be a bipolar transistor or a field-effect transistor (FET). The power amplifier PA1 is connected to the power supply terminal Vcc, for example, with a choke inductor (not illustrated) interposed therebetween.

The capacitor C1, the capacitor C2, and the switch SW1 constitute a bypass capacitor section. The bypass capacitor section is configured to change the capacitance value in accordance with the control mode of the power supply voltage supplied to the power supply terminal Vcc. The capacitor C1 includes a first end connected to a connection line between the power supply terminal Vcc and the power amplifier PA1. The capacitor C1 has a capacitance value (hereinafter referred to as "C1") of, for example, about 100 nF. The capacitor C2 includes a first end connected to a second end of the capacitor C1, and a second end connected to ground. The capacitor C2 has a capacitance value (hereinafter referred to as "C2") of, for example, about 100 pF. C1 may be larger than C2. Desirably, C1 is sufficiently larger than C2. Here, "sufficiently larger" may mean that, for example, the capacitance value is larger by about 10 times or more.

The switch SW1 includes a first terminal connected to a connection line between the second end of the capacitor C1 and the first end of the capacitor C2. The switch SW1 may be formed of, for example, an FET. The switch SW1 switches between connection and non-connection between the second end of the capacitor C1 and the ground in accordance with the control mode of the power amplifying circuit 100A.

In the ET control mode, for example, the switch SW1 is in an OFF state and the second end of the capacitor C1 is not connected to the ground. Thus, in the ET control mode, a series circuit made up of the capacitors C1 and C2 is connected to the connection line between the power supply terminal Vcc and the power amplifier PA1. Furthermore, because "C1>> C2", the series circuit has a combined capacitance value substantially equal to C2. In one example configuration, the capacitance value of the bypass capacitor section is about 100 pF in the ET control mode.

In the APT control mode, for example, the switch SW1 is in an ON state and the second end of the capacitor C1 is connected to the ground. Thus, in the APT control mode, the capacitor C1 is connected to the connection line between the power supply terminal Vcc and the power amplifier PA1. In one example configuration, the capacitance value of the bypass capacitor section is about 100 nF in the APT control mode.

(2) Operation

Figure 2:
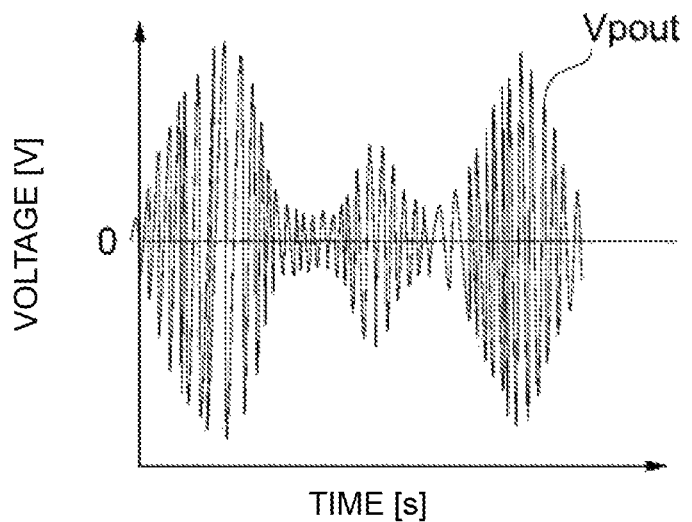
FIG. 2 includes graphs for describing an operation in an APT control mode of the power amplifying circuit.
Figure 2:
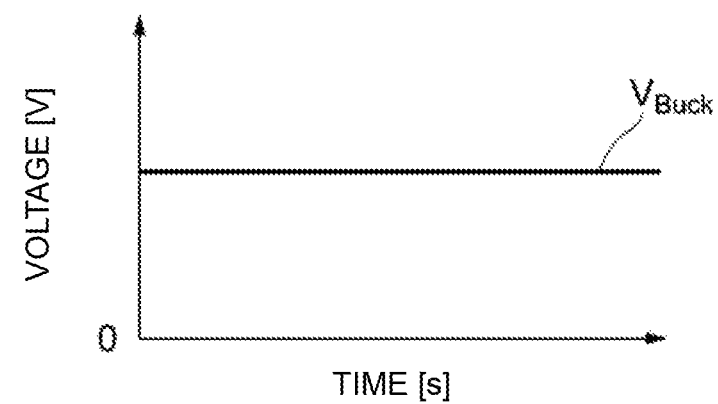
Figure 2:
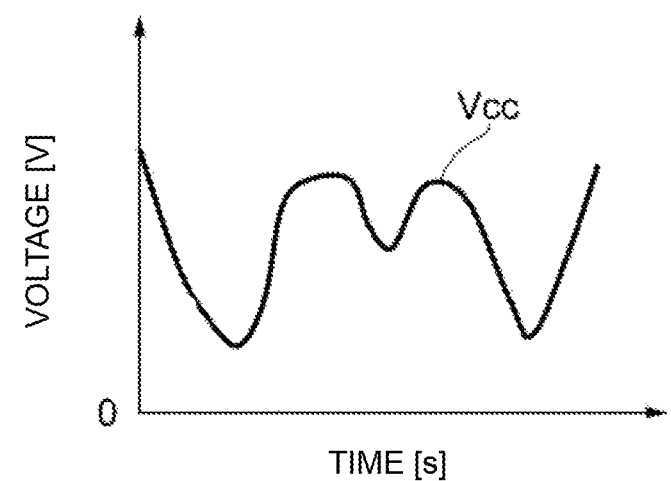

FIG. 2 includes graphs for describing an operation in the APT control mode of the power amplifying circuit 100A. The graph at the top of FIG. 2 schematically illustrates chronological changes in an output voltage Vpout of the power amplifier PA1. The graph in the middle of FIG. 2 schematically illustrates the output of the buck converter. The graph at the bottom of FIG. 2 schematically illustrates chronological changes in the voltage generated at the power supply terminal Vcc when the power supply capacity in the module is small.

As illustrated in FIG. 2, the output voltage Vpout of the power amplifier PA1 is an output signal that is proportional to change in the amplitude of a modulated signal. In the APT control mode, the nonlinearity of the transistor constituting the power amplifier PA1 causes the magnitude of a current flowing from the power supply terminal Vcc into the power amplifier PA1 to fluctuate similarly to the envelope of the modulated signal. A wiring line that connects the power amplifier PA1 and a power supply (in this case, the buck converter) has a parasitic component such as a parasitic inductance, and a voltage generated at this parasitic component is generated at the power supply terminal Vcc. The voltage generated at the power supply terminal Vcc decreases as the output voltage Vpout of the power amplifier PA1 increases. As a result, the maximum output level, gain, and linear characteristic of the power amplifier PA1 are influenced. To avoid this problem, in the first embodiment, the switch SW1 is turned ON in the APT control mode, thereby sufficiently increasing the capacitance value of the bypass capacitor section connected to the power supply terminal Vcc. Accordingly, voltage fluctuation that occurs at the power supply terminal Vcc can be reduced.

Figure 3:
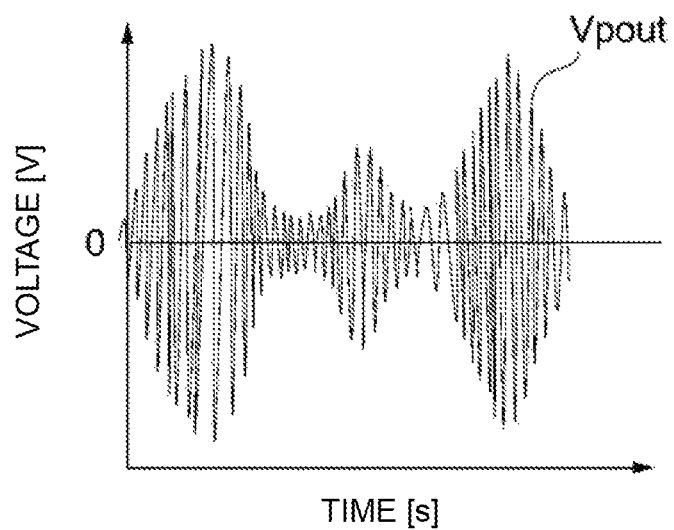
FIG. 3 includes graphs for describing an operation in an ET control mode of the power amplifying circuit.
Figure 3:
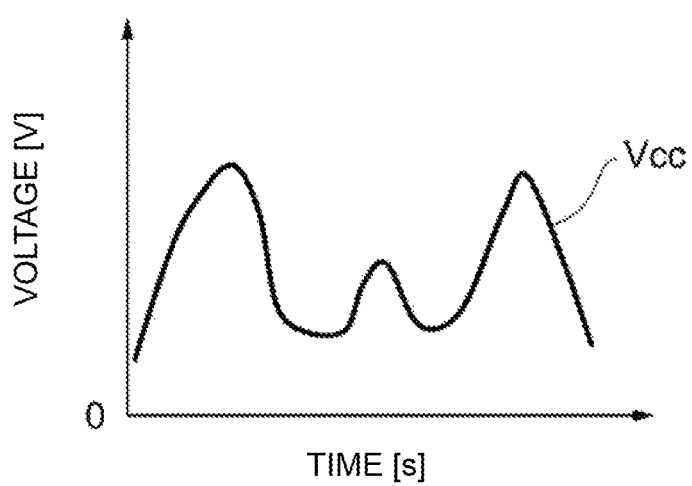

FIG. 3 includes graphs for describing an operation in the ET control mode of the power amplifying circuit 100A. The graph at the top of FIG. 3 schematically illustrates chronological changes in the output voltage Vpout of the power amplifier PA1. The graph at the bottom of FIG. 3 schematically illustrates chronological changes in the voltage generated at the power supply terminal Vcc.

As illustrated in FIG. 3, the output voltage Vpout of the power amplifier PA1 is an output signal that is proportional to change in the amplitude of a modulated signal. As illustrated in FIG. 3, the voltage at the power supply terminal Vcc in the ET control mode fluctuates in accordance with the envelope of the output voltage Vpout on the basis of the ET power supply connected to the power supply terminal Vcc. Thus, a phenomenon as described above, that is, the voltage at the power supply terminal Vcc decreases as the output voltage Vpout of the power amplifier PA1 increases, does not occur in the ET control mode. Thus, in the first embodiment, the switch SW1 is turned OFF in the ET control mode to increase an ET control speed, thereby sufficiently decreasing the capacitance value of the bypass capacitor section connected to the power supply terminal Vcc.

As described above, according to the first embodiment, in the ET control mode, the switch SW1 is in an OFF state and thus a series connection capacitance made up of the capacitor C1 and the capacitor C2 (substantially equal to C2) is connected to the power supply terminal Vcc. On the other hand, in the APT control mode, the switch SW1 is in an ON state and thus the capacitor C1 having a larger capacitance is connected to the power supply terminal Vcc. In this way, the capacitance value of the bypass capacitor section is changed in accordance with the control mode of the power supply voltage. Thus, the quality of an amplified signal increases. As described above, to adequately suppress fluctuation of the voltage generated at the power supply terminal Vcc in the APT control mode, it is desirable that C1 and C2 have a relationship "C1>>C2" (C1 is sufficiently larger than C2). Specifically, C1 is about 10 times or more C2.

First Modification Example of First Embodiment

Figure 4:
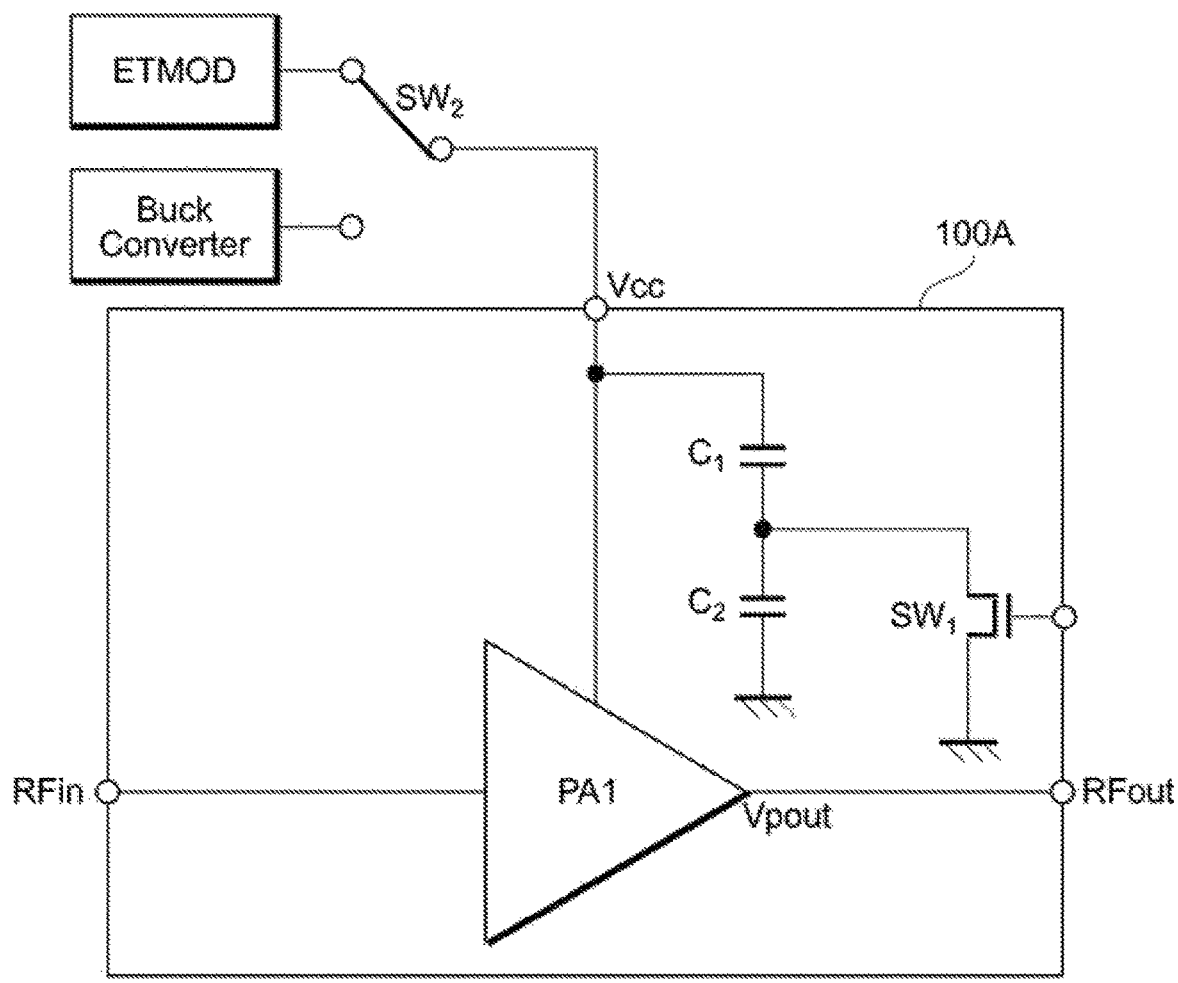
FIG. 4 is a schematic configuration diagram of a power amplifying circuit according to a first modification example of the first embodiment.

FIG. 4 is a schematic configuration diagram of a power amplifying circuit 100A-1 according to a first modification example of the first embodiment. In the power amplifying circuit 100A-1, the switch SW1 is formed of an FET.

Second Embodiment

Figure 5:
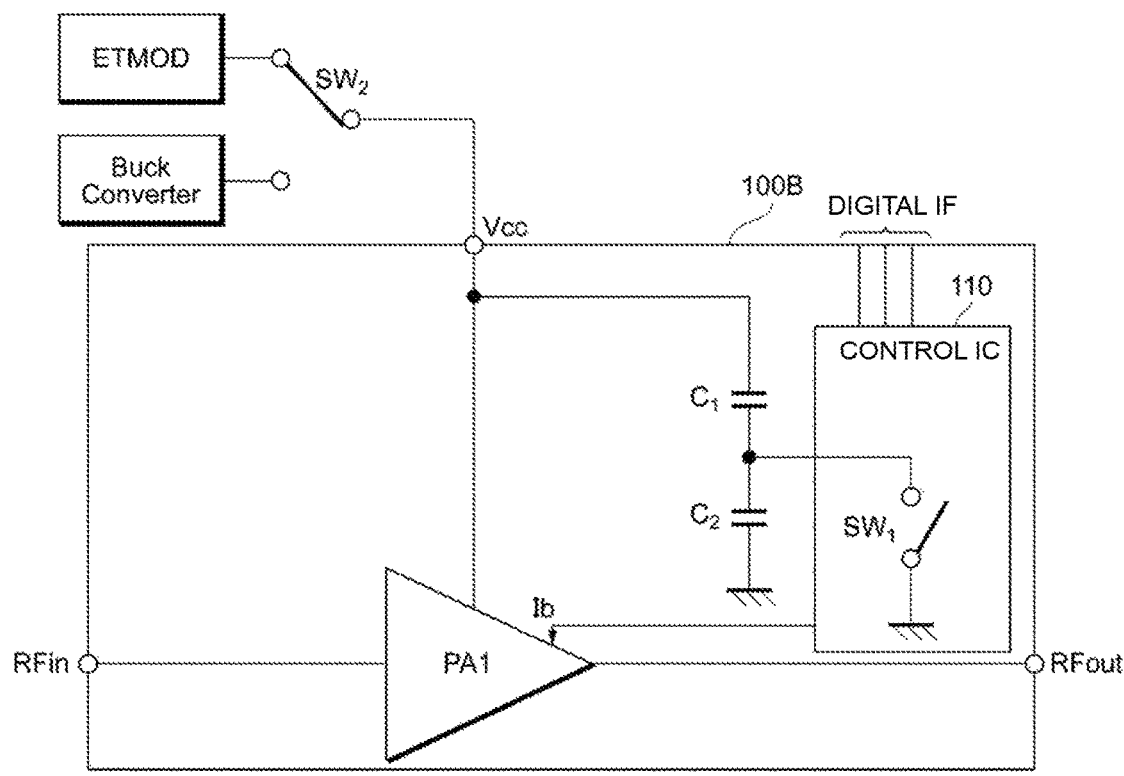
FIG. 5 is a schematic configuration diagram of a power amplifying circuit according to a second embodiment.

FIG. 5 is a schematic configuration diagram of a power amplifying circuit 100B according to a second embodiment. Hereinafter, a configuration according to the second embodiment will be described regarding the points different from the first embodiment, and a description of the points common to the first and second embodiments will be appropriately omitted.

The power amplifying circuit 100B includes a control integrated circuit (IC) 110. The control IC 110 receives a digital interface (IF) as a control signal from the outside of the power amplifying circuit 100B and controls the power amplifier PA1 and so forth on the basis of the digital IF. More specifically, the control IC 110 turns ON the switch SW1 in an APT operation and turns OFF the switch SW1 in an ET operation on the basis of the digital IF. In addition, the control IC 110 adjusts the current value of a bias current Ib of the power amplifier PA1 in accordance with an operation mode.

As illustrated in FIG. 5, in the power amplifying circuit 100B, the switch SW1 is mounted within the control IC 110. For example, the control IC 110 may be manufactured by a complementary metal oxide semiconductor (CMOS) process, and the switch SW1 may be formed of a metal oxide semiconductor field-effect transistor (MOSFET). The switch SW1 and the power amplifier PA1 may be formed within the same integrated circuit. In this case, a bipolar FET (BiFET) process, a silicon-germanium bipolar CMOS (SiGe BiCMOS) process, or the like may be applied.

First Modification Example of Second Embodiment

Figure 6:
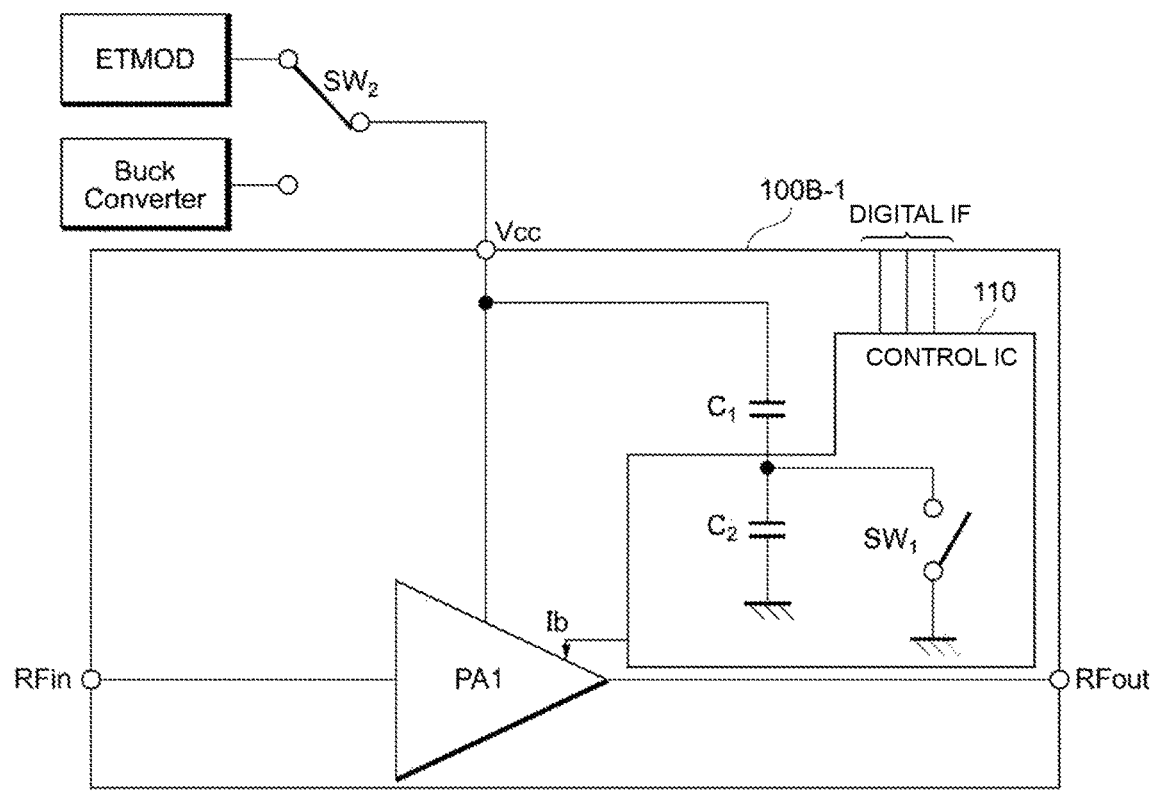
FIG. 6 is a schematic configuration diagram of a power amplifying circuit according to a first modification example of the second embodiment.

FIG. 6 is a schematic configuration diagram of a power amplifying circuit 100B-1 according to a first modification example of the second embodiment. As described above, C1 and C2 satisfy the relationship "C1>> C2". Thus, the capacitor C2 may be mounted within the control IC 110, as illustrated in FIG. 6.

As described above, in the power amplifying circuit 100B-1, the switch SW1 and the capacitor C2 are mounted within the control IC 110. This eliminates the necessity of a dedicated component for a switching function and results in a decreased number of components and size reduction. Accordingly, the capacitor C2 is connected to the switch SW1 with a decreased number of lines, and a parasitic resistance and a parasitic inductance can be reduced.

Second Modification Example of Second Embodiment

Figure 7:
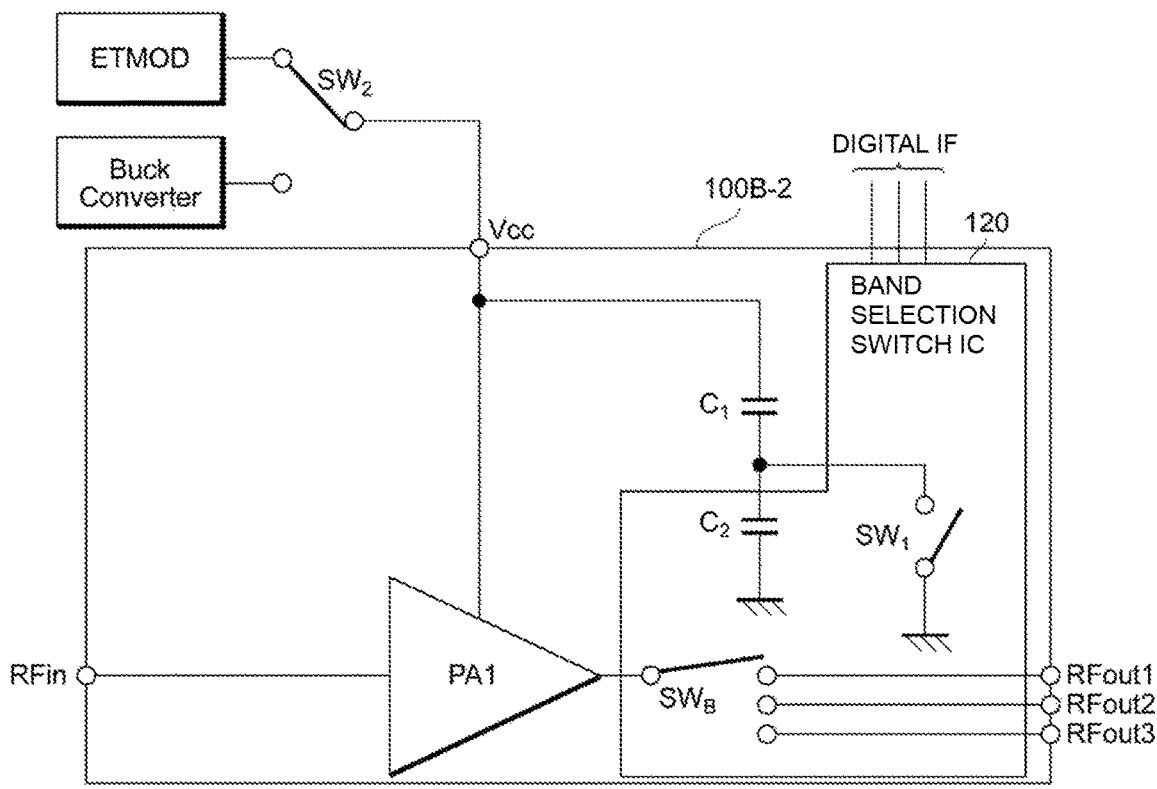
FIG. 7 is a schematic configuration diagram of a power amplifying circuit according to a second modification example of the second embodiment.

FIG. 7 is a schematic configuration diagram of a power amplifying circuit 100B-2 according to a second modification example of the second embodiment. The power amplifying circuit 100B-2 supports a plurality of communication bands (multi-bands) and includes a band selection switch IC 120. In the power amplifying circuit 100B-2, the switch SW1 and the capacitor C2 are mounted within the band selection switch IC 120.

The band selection switch IC 120 includes a switch SWB for selectively connecting an output end of the power amplifier PA1 to an output terminal RFout1, RFout2, or RFout3 in accordance with a digital IF supplied from the outside of the power amplifying circuit 100B-2. Each of the output terminals RFout1, RFout2, and RFout3 corresponds to a predetermined communication band. Although the power amplifying circuit 100B-2 supports three communication bands in this example, the number of communication bands supported by the power amplifying circuit 100B-2 is not particularly limited, and the power amplifying circuit 100B-2 may support one communication band, two communication bands, or four or more communication bands. With this configuration, the switch SW1 for switching a capacitance value and the capacitor C2 can be incorporated in the configuration used as the band selection switch IC 120, which enables a reduced size and a reduced number of wiring lines for a digital IF within the module.

Third Modification Example of Second Embodiment

Figure 8:
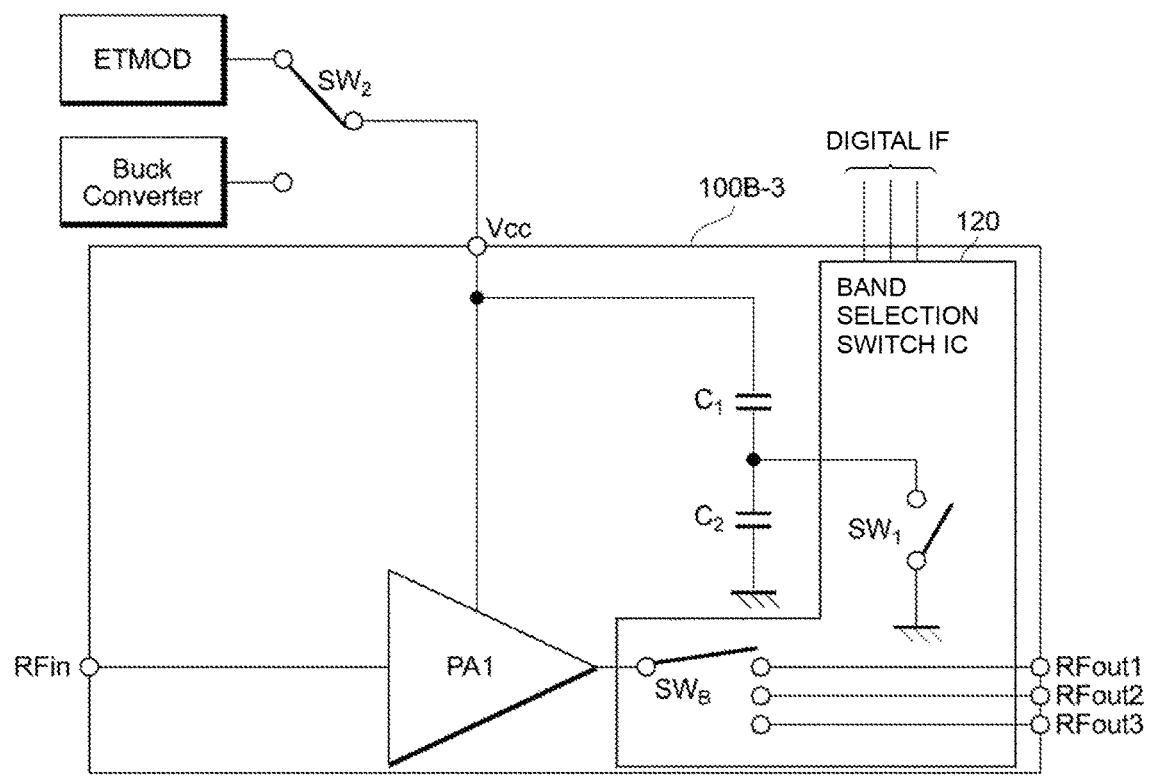
FIG. 8 is a schematic configuration diagram of a power amplifying circuit according to a third modification example of the second embodiment.

FIG. 8 is a schematic configuration diagram of a power amplifying circuit 100B-3 according to a third modification example of the second embodiment. In the power amplifying circuit 100B-3, the switch SW1 is mounted within the band selection switch IC 120 whereas the capacitor C2 is not mounted within the band selection switch IC 120. The capacitor C2 may be formed of, for example, parallel plates on or in a substrate or a chip capacitor as a surface-mounted component. With this configuration, the switch SW1 for switching a capacitance value can be incorporated in the configuration used as the band selection switch IC 120, which enables a reduced size and a reduced number of wiring lines for a digital IF within the module. In addition, with the capacitor C2 being formed within the module, an optimum capacitance value can be set for each operation mode.

Third Embodiment

Figure 9:
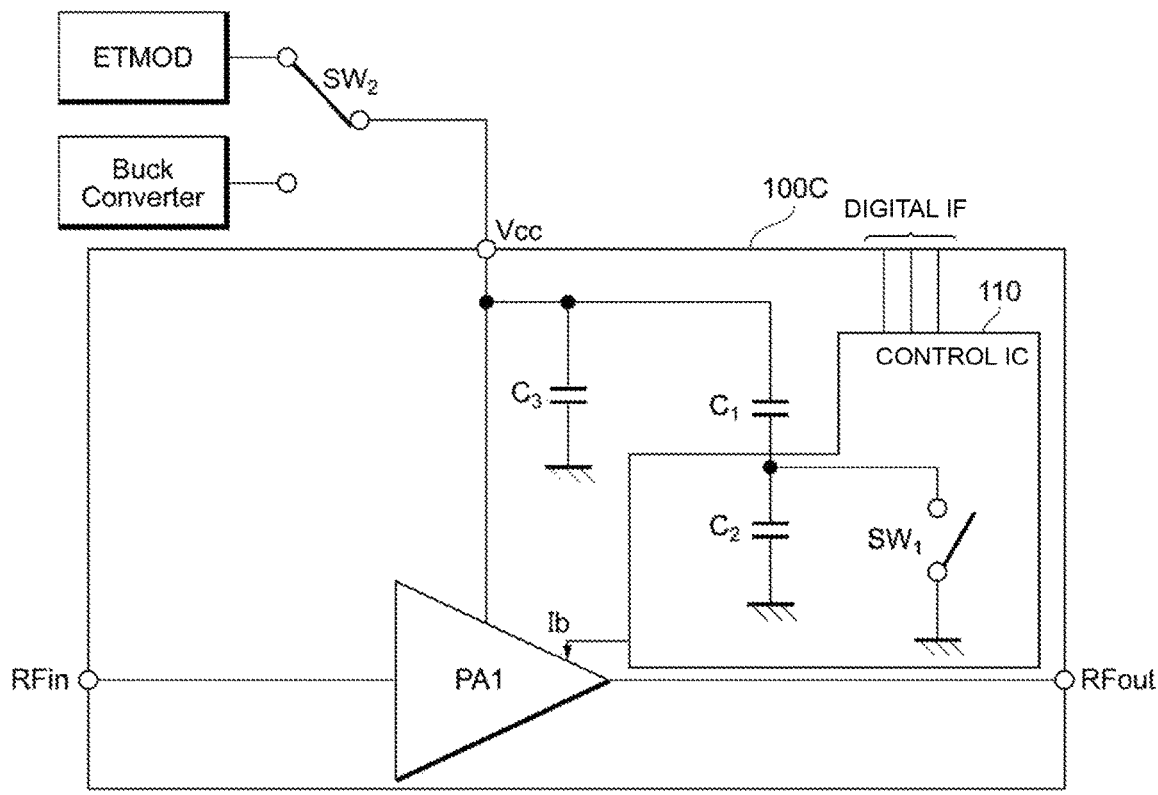
FIG. 9 is a schematic configuration diagram of a power amplifying circuit according to a third embodiment.

FIG. 9 is a schematic configuration diagram of a power amplifying circuit 100C according to a third embodiment. Hereinafter, a configuration according to the third embodiment will be described regarding the points different from the first embodiment, and a description of the points common to the first and third embodiments will be appropriately omitted.

A bypass capacitor section of the power amplifying circuit 100C further includes a capacitor C3 (a fourth capacitor). The capacitor C3 includes a first end connected to the connection line between the power supply terminal Vcc and the power amplifier PA1. The capacitor C3 includes a second end connected to the ground.

In the power amplifying circuit 100C, the switch SW1 is in an OFF state in the ET control mode. Accordingly, in the ET control mode, the bypass capacitor section has parallel capacitances of the capacitor C3 and a capacitor C12 that is made up of series capacitances of the capacitors C1 and C2. However, because "C1>> C2", the parallel capacitances may be substantially considered as parallel capacitances of the capacitors C3 and C2.

In the power amplifying circuit 100C, the switch SW1 is in an ON state in the APT control mode. Accordingly, in the APT control mode, the bypass capacitor section has parallel capacitances of the capacitors C3 and C1.

Figure 19:
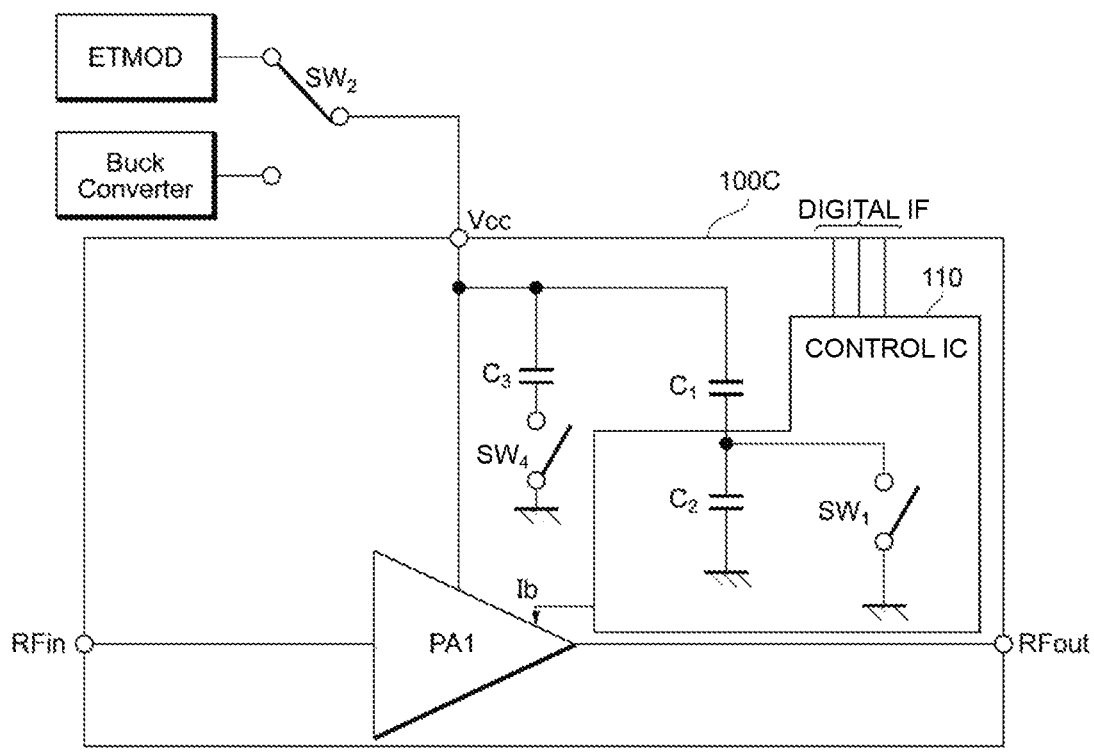
FIG. 19 is a schematic configuration diagram of a power amplifying circuit according to a modification example of the third embodiment.

In the power amplifying circuit 100C, the capacitor C3 enables the capacitance value of the bypass capacitor section to be finely adjusted. In a case where the capacitor C3 has a small capacitance value (hereinafter referred to as "C3"), the capacitor C3 can be mounted within the control IC 110 similarly to the capacitor C2. The use of the capacitor C3 for fine adjustment increases the degree of freedom of setting optimum capacitance values for both the ET and APT control modes in a case where there is a limit to the capacitance value when integrating the capacitor C2, for example. Furthermore, in the power amplifying circuit 100C in a modification example of the third embodiment shown in FIG. 19, by providing a switch SW4 (a third switch circuit) between the capacitor C3 and the ground and turning ON/OFF the switch, a combined capacitance of the capacitors C3, C2, and C1 can be adjusted. A switch may be provided in series with the capacitor C3 to further increase the degree of freedom of adjustment.

In the third embodiment and the second embodiment (including the modification examples thereof), the switch SW1 is mounted within the control IC 110. However, for example, the control IC 110 and the power amplifier PA1 may be integrated into a single IC. In this case, specifically, the IC may be formed of CMOS, silicon on insulator (SOI) CMOS, SiGe-BiCMOS, or the like. Alternatively, the switch SW1 may be mounted in the IC including the power amplifier PA1. In this case, the IC may be formed of a BiFET or the like.

First Modification Example of Third Embodiment

Figure 10A:
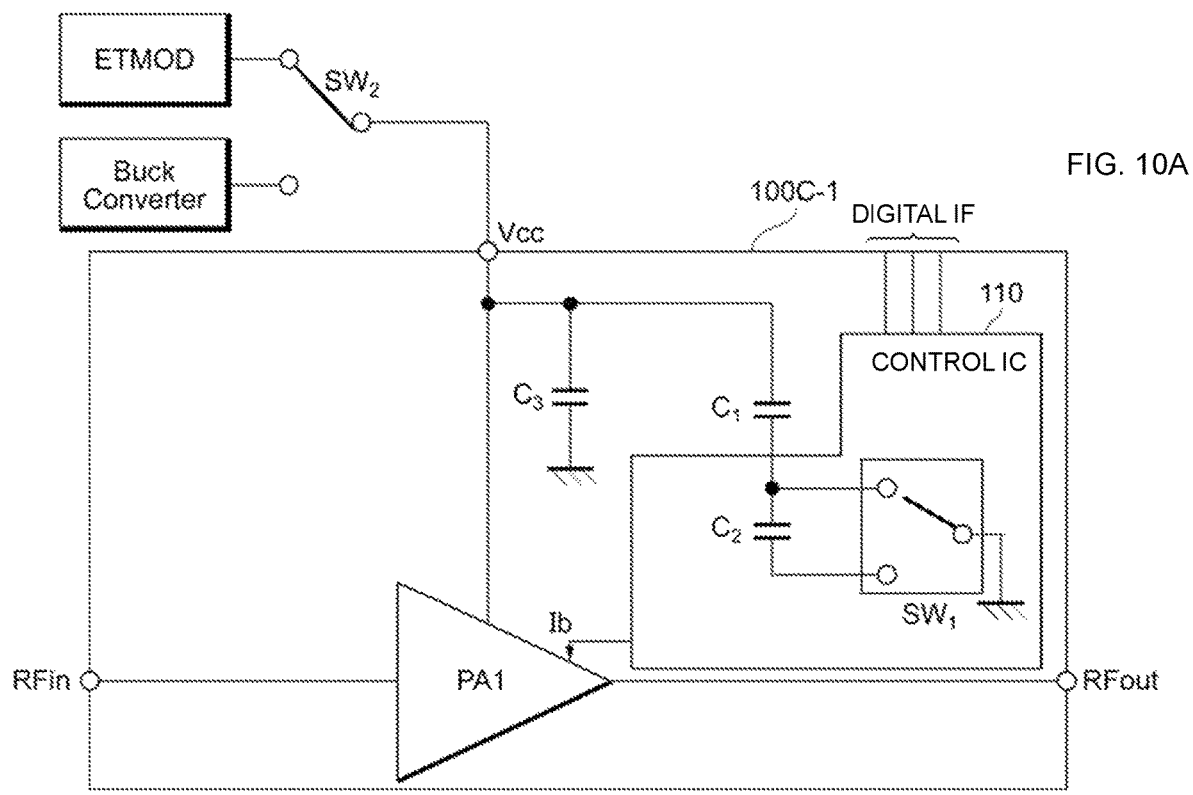
FIGS. 10A and 10B are schematic configuration diagrams of a power amplifying circuit according to a first modification example of the third embodiment.
Figure 10B:
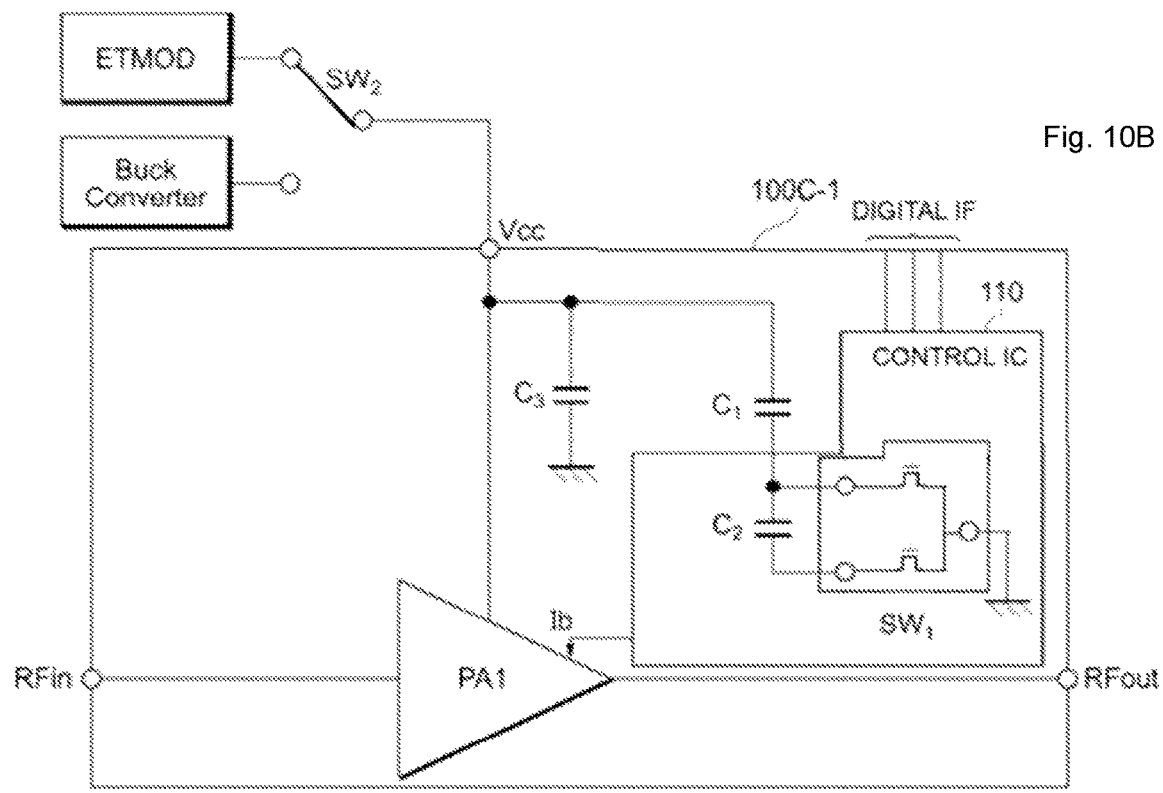

FIGS. 10A and 10B are schematic configuration diagrams of a power amplifying circuit 100C-1 according to a first modification example of the third embodiment. In the power amplifying circuit 100C-1, the switch SW1 has an SPDT configuration (see FIG. 10A) and may be formed of, for example, an FET (see FIG. 10B). The switch SW1 includes an input terminal connected to the ground. The switch SW1 includes a first output terminal connected to the first end of the capacitor C2, and a second output terminal connected to the second end of the capacitor C2. With this configuration, the second end of the capacitor C1 and the second end of the capacitor C2 can be connected to the common ground, and size reduction can be achieved.

Second Modification Example of Third Embodiment

Figure 11:
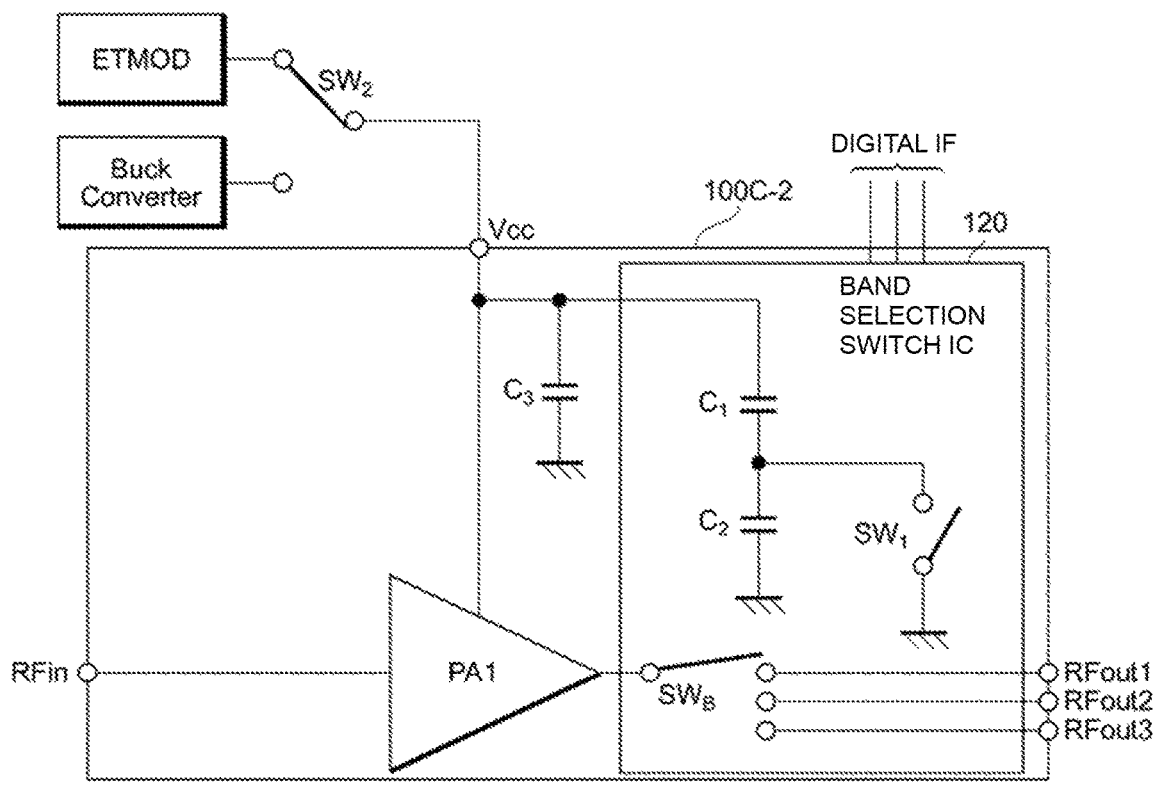
FIG. 11 is a schematic configuration diagram of a power amplifying circuit according to a second modification example of the third embodiment.

FIG. 11 is a schematic configuration diagram of a power amplifying circuit 100C-2 according to a second modification example of the third embodiment. In the power amplifying circuit 100C-2, the capacitors C1 and C2 and the switch SW1 are mounted within the band selection switch IC 120. This configuration enables a built-in structure of the bypass capacitor section made up of the capacitors C1 and C2 and the switch SW1, and eliminates the necessity of providing an unnecessary control line or wiring line in the module. Thus, size reduction can be achieved and cross talk caused by an increased number of wiring lines in the module can be reduced.

Third Modification Example of Third Embodiment

Figure 12:
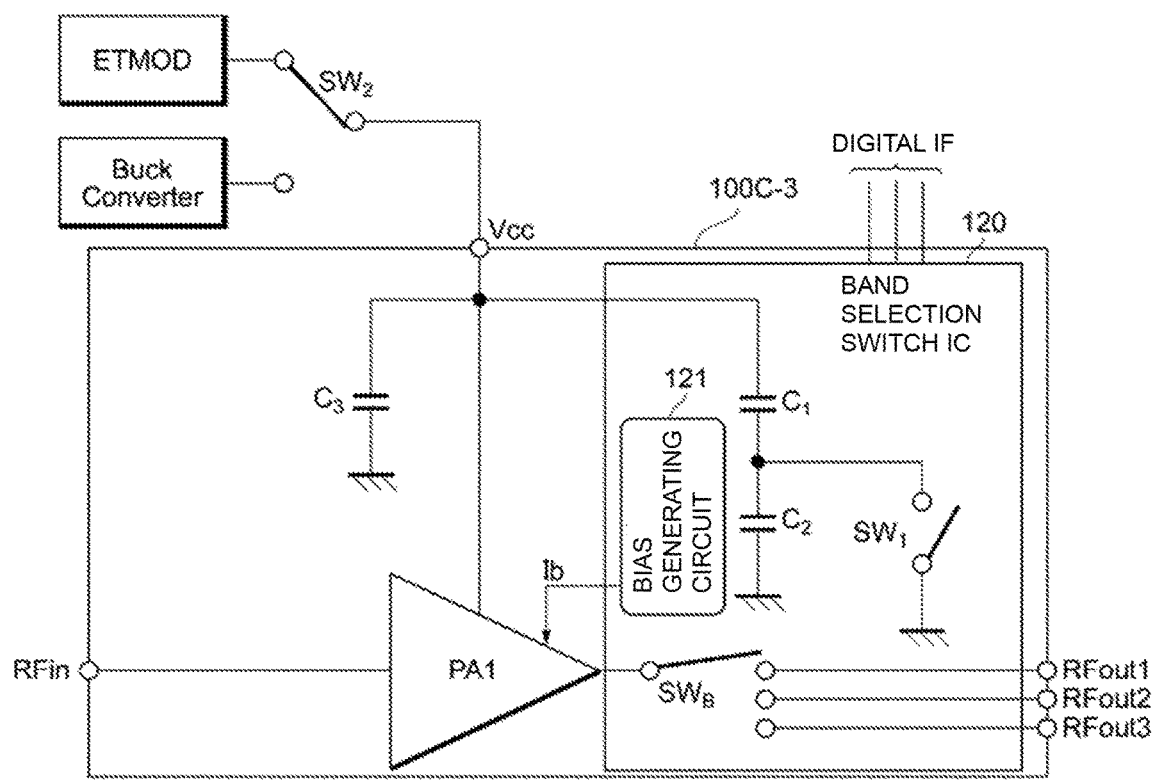
FIG. 12 is a schematic configuration diagram of a power amplifying circuit according to a third modification example of the third embodiment.

FIG. 12 is a schematic configuration diagram of a power amplifying circuit 100C-3 according to a third modification example of the third embodiment. In the power amplifying circuit 100C-3, a bias generating circuit 121 that supplies a bias current Ib to the power amplifier PA1 is mounted within the band selection switch IC 120 in addition to the capacitors C1 and C2 and the switch SW1. This configuration enables a built-in structure of the bypass capacitor section made up of the capacitors C1 and C2 and the switch SW1, enables integration of a band selection switch group and a control IC into a single IC, and eliminates the necessity of providing an unnecessary control line or wiring line in the module. Thus, size reduction can be achieved and cross talk caused by an increased number of wiring lines in the module can be reduced.

Fourth Modification Example of Third Embodiment

Figure 13:
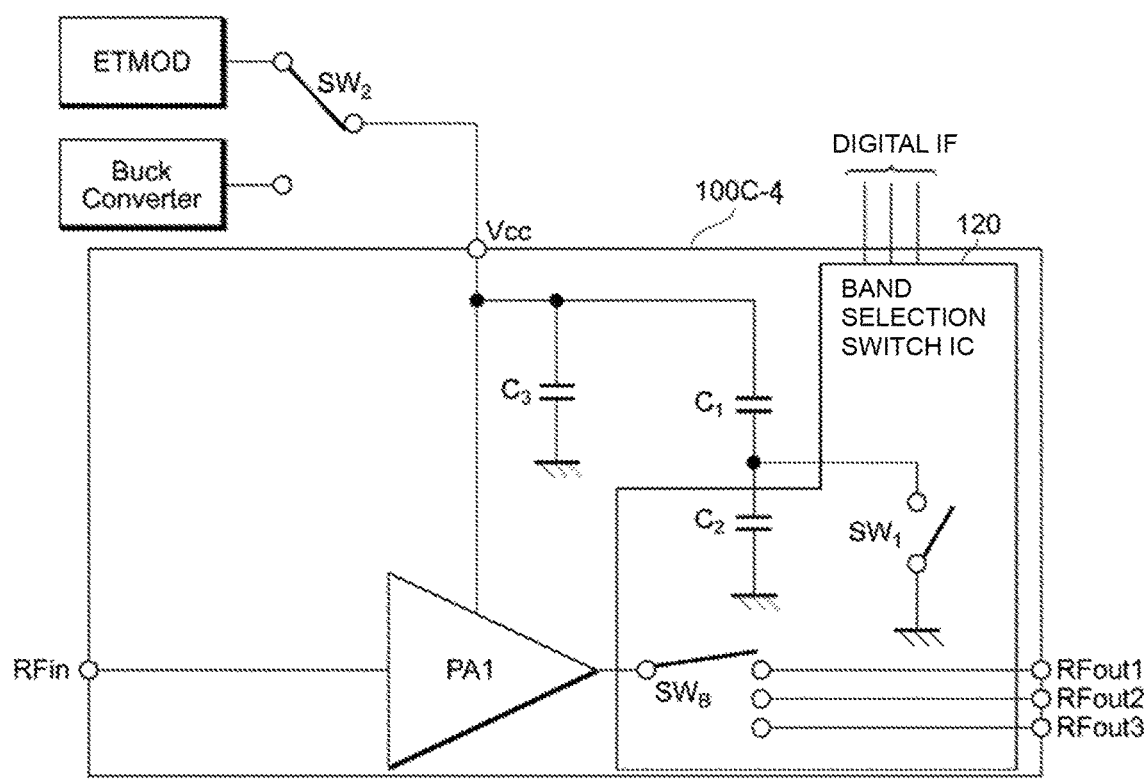
FIG. 13 is a schematic configuration diagram of a power amplifying circuit according to a fourth modification example of the third embodiment.

FIG. 13 is a schematic configuration diagram of a power amplifying circuit 100C-4 according to a fourth modification example of the third embodiment. In the power amplifying circuit 100C-4, the switch SW1 and the capacitor C2 are mounted within the band selection switch IC 120. This configuration enables a built-in structure of the bypass capacitor section made up of the capacitor C2 and the switch SW1, enables integration of a band selection switch group into a single IC, and eliminates the necessity of providing an unnecessary control line or wiring line in the module. Thus, size reduction can be achieved and cross talk caused by an increased number of wiring lines in the module can be reduced. The component to be mounted as the capacitor C1 may be changed in accordance with the characteristics of operation modes, and accordingly the characteristics of the power amplifying circuit can be adjusted.

Fifth Modification Example of Third Embodiment

Figure 14:
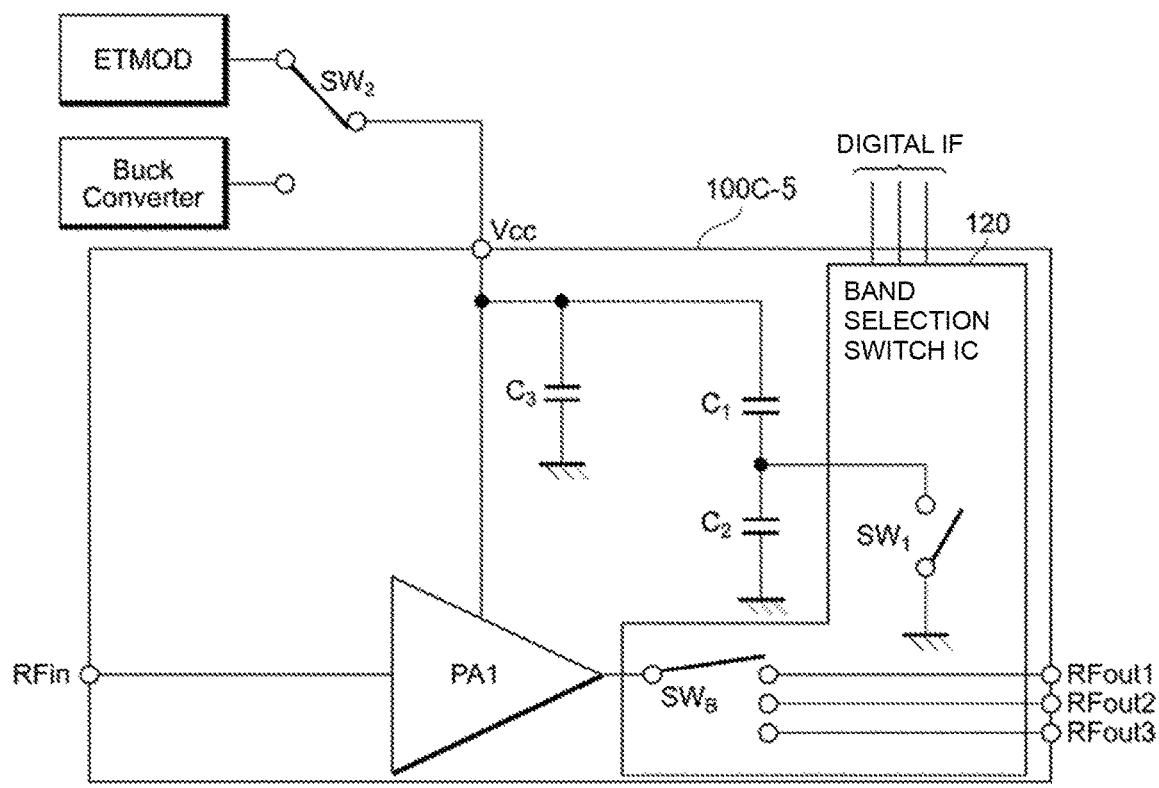
FIG. 14 is a schematic configuration diagram of a power amplifying circuit according to a fifth modification example of the third embodiment.

FIG. 14 is a schematic configuration diagram of a power amplifying circuit 100C-5 according to a fifth modification example of the third embodiment. In the power amplifying circuit 100C-5, the switch SW1 is mounted within the band selection switch IC 120. This configuration enables a built-in structure of the bypass capacitor section made up of the switch SW1, enables integration of a band selection switch group and a control IC into a single IC, and eliminates the necessity of providing an unnecessary control line or wiring line in the module. Thus, size reduction can be achieved and cross talk caused by an increased number of wiring lines in the module can be reduced. The components to be mounted as the capacitors C1 and C2 may be changed in accordance with the characteristics of operation modes, and accordingly the characteristics of the power amplifying circuit can be adjusted.

Fourth Embodiment

Figure 15:
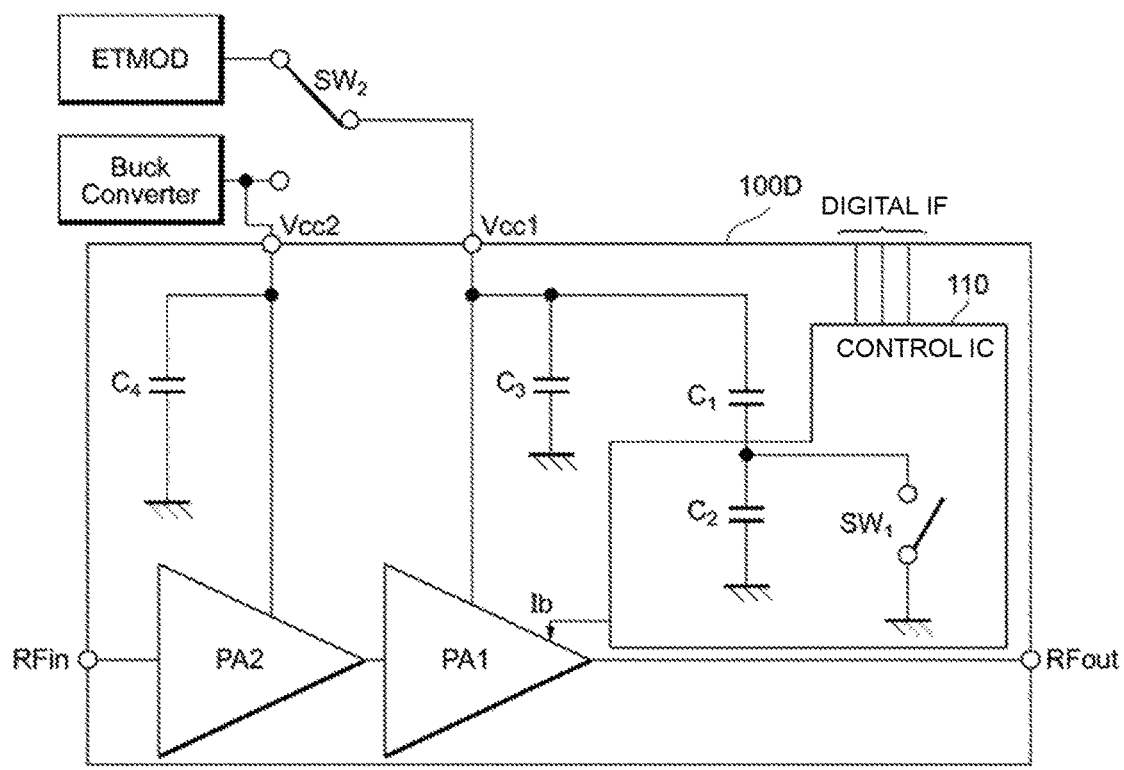
FIG. 15 is a schematic configuration diagram of a power amplifying circuit according to a fourth embodiment.

FIG. 15 is a schematic configuration diagram of a power amplifying circuit 100D according to a fourth embodiment. Hereinafter, a configuration according to the fourth embodiment will be described regarding the points different from the first embodiment, and a description of the points common to the first and fourth embodiments will be appropriately omitted.

The power amplifying circuit 100D further includes a power amplifier PA2 and a capacitor C4. The power amplifying circuit 100D amplifies an RF signal in two stages. Specifically, in the power amplifying circuit 100D, the power amplifier PA2 serves as a first-stage (driver-stage) amplifier, and the power amplifier PA1 serves as a second-stage (power-stage) amplifier.

The power amplifying circuit 100D includes power supply terminals Vcc1 and Vcc2. The power supply terminal Vcc1 corresponds to the power supply terminal Vcc according to the first embodiment and is selectively supplied with a power supply voltage from the ET modulator or the buck converter. The power supply terminal Vcc2 is supplied with a power supply voltage from the buck converter.

The capacitor C4 constitutes a bypass capacitor section for the power amplifier PA2. The capacitor C4 includes a first end connected to a connection line between the power supply terminal Vcc2 and the power amplifier PA2. The capacitor C4 includes a second end connected to the ground. The capacitance C4 has a capacitance value (hereinafter referred to as "C4") of, for example, about 50 pF. In the power amplifiers PA1 and PA2 in the two stages illustrated in FIG. 15, switching between an ET operation and an APT operation is performed only in the power amplifier PA1 in the second stage. Thus, in the case of outputting large power, the power amplifier PA2 does not include a switch SW in the bypass capacitor section and thus a capacitance value can be adjusted at only a necessary portion in the two-stage configuration. This makes it possible to reduce the size of the module.

First Modification Example of Fourth Embodiment

Figure 16:
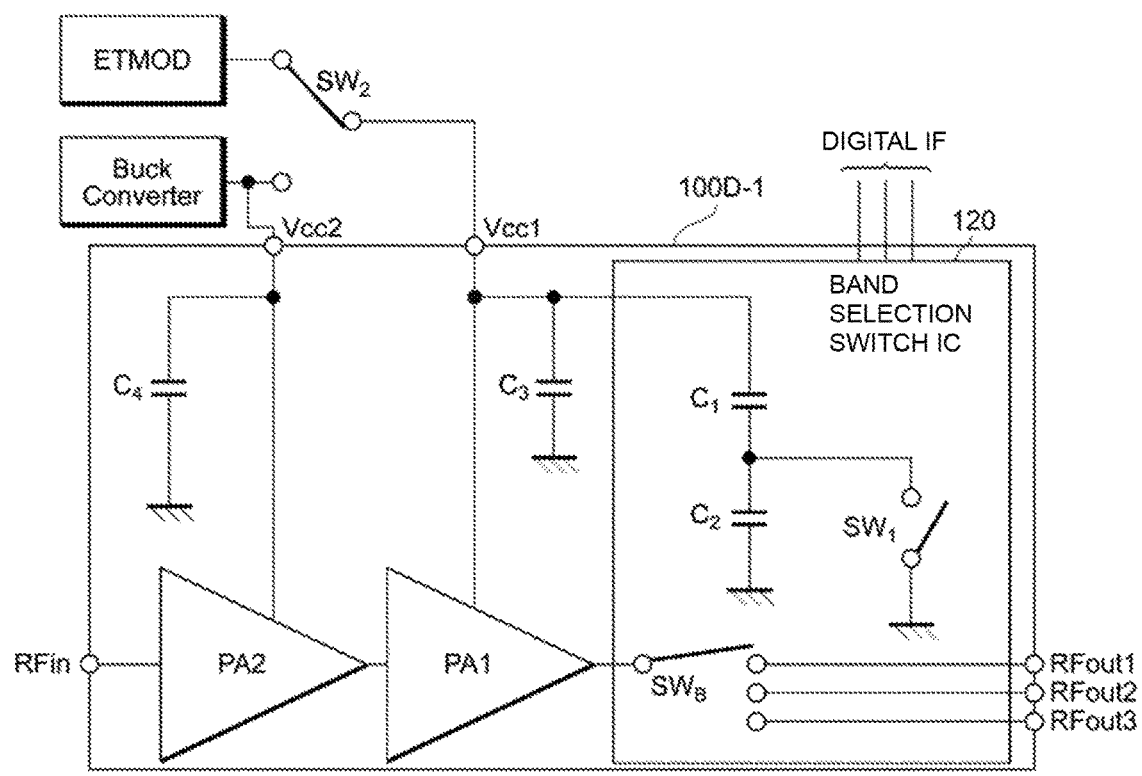
FIG. 16 is a schematic configuration diagram of a power amplifying circuit according to a first modification example of the fourth embodiment.

FIG. 16 is a schematic configuration diagram of a power amplifying circuit 100D-1 according to a first modification example of the fourth embodiment. In the power amplifying circuit 100D-1, the switch SW1 and the capacitors C1 and C2 are mounted within the band selection switch IC 120. As in the fourth embodiment, in the power amplifiers PA1 and PA2 in the two stages illustrated in FIG. 16, switching between an ET operation and an APT operation is performed only in the power amplifier PA1 in the second stage. Thus, in the case of outputting large power, the power amplifier PA2 does not include a switch SW in the bypass capacitor section and thus a capacitance value can be adjusted at only a necessary portion in the two-stage configuration. This makes it possible to reduce the size of the module.

Second Modification Example of Fourth Embodiment

Figure 17:
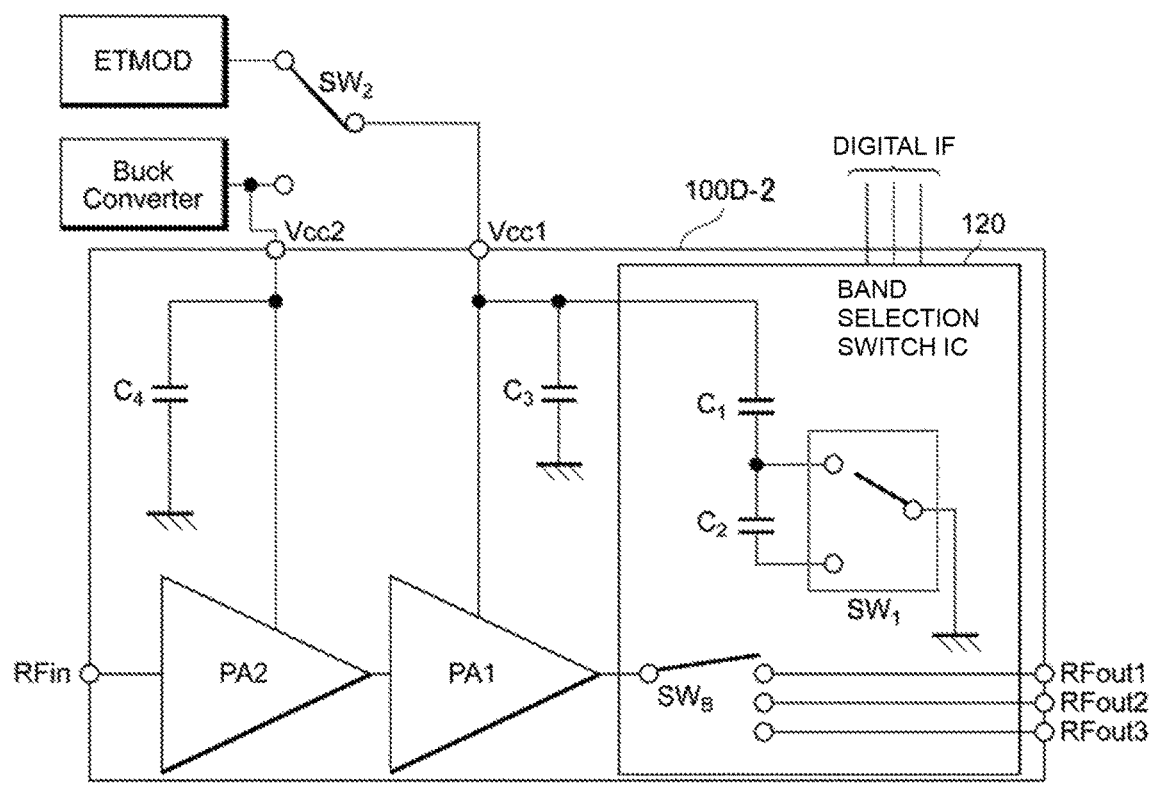
FIG. 17 is a schematic configuration diagram of a power amplifying circuit according to a second modification example of the fourth embodiment.

FIG. 17 is a schematic configuration diagram of a power amplifying circuit 100D-2 according to a second modification example of the fourth embodiment. In the power amplifying circuit 100D-2, the switch SW1 has an SPDT configuration. The switch SW1 includes an input terminal connected to the ground. The switch SW1 includes a first output terminal connected to the first end of the capacitor C2, and a second output terminal connected to the second end of the capacitor C2. With this configuration, the second end of the capacitor C1 and the second end of the capacitor C2 can be connected to the common ground, and size reduction can be achieved.

Fifth Embodiment

Figure 18:
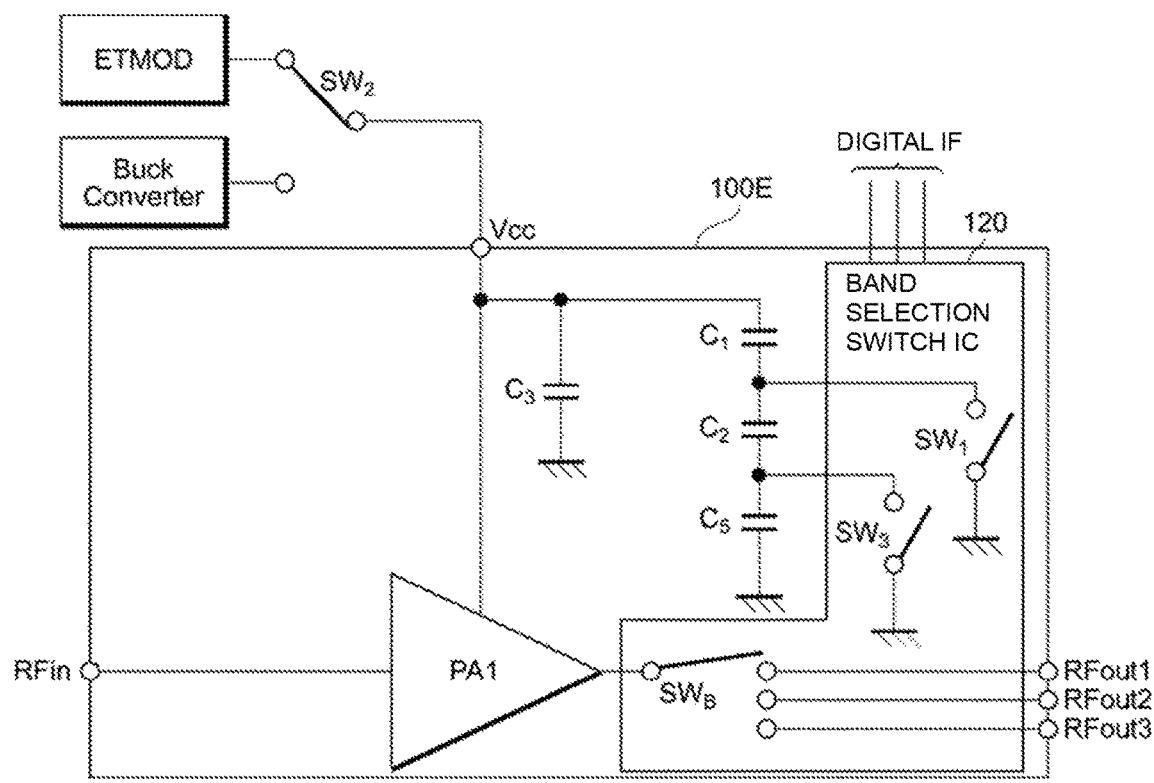
FIG. 18 is a schematic configuration diagram of a power amplifying circuit according to a fifth embodiment.

FIG. 18 is a schematic configuration diagram of a power amplifying circuit 100E according to a fifth embodiment. Hereinafter, the configuration of the power amplifying circuit 100E according to the fifth embodiment will be described regarding the points different from the power amplifying circuit 100C-4 according to the fourth modification example of the third embodiment, and a description of the points common to both will be appropriately omitted.

A bypass capacitor section of the power amplifying circuit 100E further includes a capacitor C5 (a third capacitor) and a switch SW3 (a second switch circuit). The capacitor C5 includes a first end connected to the second end of the capacitor C2 and a second end connected to the ground.

The switch SW3 includes a first terminal that is connected to a connection line between the second end of the capacitor C2 and the first end of the capacitor C5. The switch SW3 may be formed of a FET, for example. The switch SW3 switches between connection and non-connection between the second end of the capacitor C2 and the ground in accordance with the control mode of the power amplifying circuit 100E. With use of the switches SW1 and SW3, a capacitance value can be selected from among three capacitance values. Thus, an optimum capacitance value can be selected in the case of switching a power supply by using the switch SW2.

Various embodiments of the present disclosure have been described above. A power amplifying circuit according to an embodiment of the present disclosure includes a bipolar transistor that amplifies a radio-frequency signal, and a bypass capacitor section connected between a collector end of the bipolar transistor and a power supply terminal connected to the collector end. The bypass capacitor section includes a first capacitor including a first end and a second end, a second capacitor including a first end and a second end, and a first switch circuit including a first terminal and a second terminal. The first end of the first capacitor is connected to the power supply terminal, and the second end of the first capacitor is connected to the first end of the second capacitor and the first terminal of the first switch circuit. The second end of the second capacitor is connected to ground. The second terminal of the first switch circuit is connected to the ground. Switching between ON and OFF of the first switch circuit causes switching between connection and non-connection between the second end of the first capacitor and the ground.

According to this embodiment, switching between a decoupling capacitance suitable for ET control and a decoupling capacitance suitable for APT control can be performed without necessarily using a complicated switch configuration, and the withstand voltage of a capacitance element can be decreased.

A power amplifying circuit according to another embodiment of the present disclosure includes a bipolar transistor that amplifies a radio-frequency signal, and a bypass capacitor section connected between a collector end of the bipolar transistor and a power supply terminal connected to the collector end. The bypass capacitor section includes a first capacitor including a first end and a second end, a second capacitor including a first end and a second end, and a first switch circuit including a first terminal, a second terminal, and a third terminal. The first end of the first capacitor is connected to the power supply terminal, and the second end of the first capacitor is connected to the first terminal of the first switch circuit. The second terminal of the first switch circuit is connected to ground, and the third terminal of the first switch circuit is connected to the second end of the second capacitor. Switching between paths of the first switch circuit causes switching between connection and non-connection between the second capacitor and the ground.

According to this embodiment, switching between a decoupling capacitance suitable for ET control and a decoupling capacitance suitable for APT control can be performed without necessarily using a complicated switch configuration, and the withstand voltage of a capacitance element can be decreased.

A power amplifying circuit according to another embodiment of the present disclosure includes a field-effect transistor that amplifies a radio-frequency signal, and a bypass capacitor section connected between a drain end of the field-effect transistor and a power supply terminal connected to the drain end. The bypass capacitor section includes a first capacitor including a first end and a second end, a second capacitor including a first end and a second end, and a first switch circuit including a first terminal and a second terminal. The first end of the first capacitor is connected to the power supply terminal, and the second end of the first capacitor is connected to the first end of the second capacitor and the first terminal of the first switch circuit. The second end of the second capacitor is connected to ground. The second terminal of the first switch circuit is connected to the ground. Switching between ON and OFF of the first switch circuit causes switching between connection and non-connection between the second end of the first capacitor and the ground.

According to this embodiment, switching between a decoupling capacitance suitable for ET control and a decoupling capacitance suitable for APT control can be performed without necessarily using a complicated switch configuration, and the withstand voltage of a capacitance element can be decreased.

A power amplifying circuit according to another embodiment of the present disclosure includes a field-effect transistor that amplifies a radio-frequency signal, and a bypass capacitor section connected between a drain end of the field-effect transistor and a power supply terminal connected to the drain end. The bypass capacitor section includes a first capacitor including a first end and a second end, a second capacitor including a first end and a second end, and a first switch circuit including a first terminal, a second terminal, and a third terminal. The first end of the first capacitor is connected to the power supply terminal, and the second end of the first capacitor is connected to the first terminal of the first switch circuit. The second terminal of the first switch circuit is connected to ground, and the third terminal of the first switch circuit is connected to the second end of the second capacitor. Switching between paths of the first switch circuit causes switching between connection and non-connection between the second capacitor and the ground.

According to this embodiment, switching between a decoupling capacitance suitable for ET control and a decoupling capacitance suitable for APT control can be performed without necessarily using a complicated switch configuration, and the withstand voltage of a capacitance element can be decreased.

In any one of the above-described power amplifying circuits, the first capacitor may have a larger capacitance value than the second capacitor.

With this configuration, the capacitance value of the bypass capacitor section is easily changed in accordance with a control mode of a power supply voltage.

In any one of the above-described power amplifying circuits, the first switch circuit may not cause the second end of the first capacitor to be connected to the ground in an ET control mode, and may cause the second end of the first capacitor to be connected to the ground in an APT control mode.

With this configuration, the quality of an amplified signal can be increased by decreasing the capacitance value of the bypass capacitor section in the ET control mode and increasing the capacitance value of the bypass capacitor section in the APT control mode.

In any one of the above-described power amplifying circuits, the second end of the second capacitor may be directly connected to the ground.

With this configuration, the configuration of the first switch circuit is simplified.

In any one of the above-described power amplifying circuits, the bypass capacitor section may further include a third capacitor including a first end connected to the second end of the second capacitor and a second end connected to the ground, and a second switch circuit that switches between connection and non-connection between the second end of the second capacitor and the ground.

With this configuration, switching between a decoupling capacitance suitable for ET control and a decoupling capacitance suitable for APT control can be performed without necessarily using a complicated switch configuration, and the withstand voltage of a capacitance element can be decreased.

In any one of the above-described power amplifying circuits, the bypass capacitor section may further include a fourth capacitor including a first end connected to the power supply terminal and a second end connected to the ground.

With this configuration, switching between a decoupling capacitance suitable for ET control and a decoupling capacitance suitable for APT control can be performed without necessarily using a complicated switch configuration, and the withstand voltage of a capacitance element can be decreased.

In any one of the above-described power amplifying circuits, the bypass capacitor section may further include a third switch circuit that switches between connection and non-connection between the second end of the fourth capacitor and the ground.

With this configuration, switching between a decoupling capacitance suitable for ET control and a decoupling capacitance suitable for APT control can be performed without necessarily using a complicated switch configuration, and the withstand voltage of a capacitance element can be decreased.

In any one of the above-described power amplifying circuits, the first switch circuit may include a field-effect transistor.

With this configuration, the configuration of the first switch circuit is simplified.

The description of the embodiments has been given to facilitate the understanding of the present disclosure and is not intended to limit the present disclosure. The elements described in the embodiments and the arrangements, materials, conditions, shapes, sizes, and so forth thereof are not limited to those described as examples and can be appropriately changed. The elements described in different embodiments can be partially replaced or combined.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifying circuit comprising:
    a transistor configured to amplify a radio-frequency signal; and
    a bypass capacitor section connected to a path that connects a collector end or a drain end of the transistor to a power supply terminal, wherein:
    the bypass capacitor section comprises a first capacitor, a second capacitor, and a first switch circuit,
    a first end of the first capacitor is connected to the power supply terminal, and a second end of the first capacitor is connected to a first end of the second capacitor and a first terminal of the first switch circuit,
    a second end of the second capacitor is connected to ground,
    a second terminal of the first switch circuit is connected to ground, and
    the first switching circuit is configured to selectively cause connection of the second end of the first capacitor to ground.

2. A power amplifying circuit comprising:
    a transistor configured to amplify a radio-frequency signal; and
    a bypass capacitor section connected to a path that connects a collector end or a drain end of the transistor to a power supply terminal, wherein:
    the bypass capacitor section comprises a first capacitor, a second capacitor, and a first switch circuit,
    a first end of the first capacitor is connected to the power supply terminal, and a second end of the first capacitor is connected to a first terminal of the first switch circuit and to a first terminal of the second capacitor,
    a second terminal of the first switch circuit is connected to ground, and a third terminal of the first switch circuit is connected to a second end of the second capacitor, and
    the first switch circuit is configured to selectively cause connection of the second capacitor to ground.

3. The power amplifying circuit according to claim 1, wherein the transistor is a bipolar transistor.

4. The power amplifying circuit according to claim 2, wherein the transistor is a bipolar transistor.

5. The power amplifying circuit according to claim 1, wherein the transistor is a field-effect transistor.

6. The power amplifying circuit according to claim 2, wherein the transistor is a field-effect transistor.

7. The power amplifying circuit according to claim 1, wherein the first capacitor has a larger capacitance value than the second capacitor.

8. The power amplifying circuit according to claim 2, wherein the first capacitor has a larger capacitance value than the second capacitor.

9. The power amplifying circuit according to claim 1, wherein the first switch circuit is configured to selectively cause the second end of the first capacitor to be disconnected from ground when the power amplifying circuit operates in an envelope tracking control mode, and to selectively cause the second end of the first capacitor to be connected to ground when the power amplifying circuit operates in an average power tracking control mode.

10. The power amplifying circuit according to claim 2, wherein the first switch circuit is configured to selectively cause the second end of the first capacitor to be disconnected from ground when the power amplifying circuit operates in an envelope tracking control mode, and to selectively cause the second end of the first capacitor to be connected to ground when the power amplifying circuit operates in an average power tracking control mode.

11. The power amplifying circuit according to claim 1, wherein the second end of the second capacitor is directly connected to ground.

12. The power amplifying circuit according to claim 1, wherein the bypass capacitor section further comprises:
    a third capacitor having a first end connected to the second end of the second capacitor and a second end connected to ground, and
    a second switch circuit configured to selectively connect the second end of the second capacitor to ground.

13. The power amplifying circuit according to claim 1, wherein the bypass capacitor section further comprises a fourth capacitor having a first end connected to the power supply terminal and a second end connected to ground.

14. The power amplifying circuit according to claim 2, wherein the bypass capacitor section further comprises a fourth capacitor having a first end connected to the power supply terminal and a second end connected to ground.

15. The power amplifying circuit according to claim 13, wherein the bypass capacitor section further comprises a third switch circuit configured to selectively cause connection of the second end of the fourth capacitor to ground.

16. The power amplifying circuit according to claim 14, wherein the bypass capacitor section further comprises a third switch circuit configured to selectively cause connection of the second end of the fourth capacitor to ground.

17. The power amplifying circuit according to claim 1, wherein the first switch circuit comprises a field-effect transistor.

18. The power amplifying circuit according to claim 2, wherein the first switch circuit comprises a field-effect transistor.

* * * * *